United States Patent [19]
Komori et al.

[11] Patent Number: 5,155,701
[45] Date of Patent: Oct. 13, 1992

[54] SEMICONDUCTOR INTEGRATED CIRCUIT DEVICE AND METHOD OF TESTING THE SAME

[75] Inventors: Kazuhiro Komori, Kodaira; Yuji Hara; Hideaki Takahashi, both of Koganei; Minoru Fukuda, Tateno; Satoshi Meguro, Hinode, all of Japan

[73] Assignee: Hitachi, Ltd., Tokyo, Japan

[21] Appl. No.: 535,298

[22] Filed: Jun. 8, 1990

Related U.S. Application Data

[63] Continuation of Ser. No. 827,614, Feb. 10, 1986, abandoned.

[30] Foreign Application Priority Data

Feb. 8, 1985 [JP] Japan .................. 60-21697

[51] Int. Cl.⁵ .................. G11C 29/00; G11C 16/00; G11C 16/04
[52] U.S. Cl. .................. 365/182; 365/185; 365/201
[58] Field of Search .................. 365/104, 185, 189.01, 365/189.07, 201, 174, 182

[56] References Cited

U.S. PATENT DOCUMENTS

| | | | |
|---|---|---|---|
| 4,543,647 | 9/1985 | Yoshida | 365/201 |
| 4,553,225 | 11/1985 | Ohe | 365/201 |
| 4,612,630 | 9/1986 | Rosier | 365/201 |
| 4,631,724 | 12/1986 | Shimizu | 365/201 |
| 4,718,042 | 1/1988 | Moll et al. | 365/201 |
| 4,956,816 | 9/1990 | Atsumi et al. | 365/201 |

OTHER PUBLICATIONS

Hitachi IC Memory Data Book, p. 263, May 1984.

*Primary Examiner*—Alyssa H. Bowler
*Attorney, Agent, or Firm*—Antonelli, Terry, Stout & Kraus

[57] ABSTRACT

An EPROM and a method of testing the former, in which a defective memory cell caused by defects in the insulating films between a substrate and a floating gate and between the floating gate and a control gate can be tested without writing any data in the individual memory cells by holding data lines to a low potential and word lines fed with a voltage.

8 Claims, 5 Drawing Sheets

SEMICONDUCTOR INTEGRATED CIRCUIT DEVICE AND METHOD OF TESTING THE SAME

This application is a continuation of application Ser. No. 827,614, filed on Feb. 10, 1986, now abandoned.

BACKGROUND OF THE INVENTION

The present invention relates to a semiconductor integrated circuit device and, more particularly, to both a semiconductor memory device to be suitably used as a PROM (i.e., Programmable Read Only Memory) and a method of testing the same.

The following method is conceivable as a method of testing deterioration of data retention of an EPROM (Erasable and Programmable ROM). Data are temporarily written (or charges are injected into) in all the bits of a memory thereby to set the individual bits to "0" (all "0"). The bit is then held at a high temperature such as 150° C for some time. After this, all the bits are read out to detect those memory cells where the data "0" have been changed to data "1" (i.e., the state in which no charge is injected nor stored). By this detection, defective bits can be identified. The method described above is based upon the following principle. It is here assumed that a defect or the like has occurred in insulating films between the substrate and floating gate or between the floating gate and the control gate. The charges (e.g., negative charges for an N-channel MOSFET), which are injected into (or stored in) the floating gate by the writing operation, are caused to migrate through the aforementioned defect into the control gate or another portion as a result of it having been held at a high temperature. As a result, the charges are lost (or discharged) to induce a state in which no writing has been conducted.

This method is effective for an EPROM in which written data is erased by being irradiated with ultraviolet rays or the like even after it has been sealed. Despite this advantage, however, the method cannot be applied as it is to the OTP (i.e., One Time Programmable) type EPROM which has been proposed recently. This OTP type EPROM is intended to simplify its product structure and reduce its production cost by packaging an EPROM chip with plastics or the like. As a result, the data cannot be erased once it has been written in the EPROM element which has been sealed for packaging Therefore, the aforementioned method presuming the writing operation of all bits cannot be adopted after the EPROM chip has been packaged and sealed.

By the above reasoning, the OTP type EPROM requires another testing m'ethod such as a method by which the aforementioned test is conducted in a wafer state, for example, so that the EPROM is sealed up after erasure with ultraviolet rays. Meanwhile, however, it is desirable that the aforementioned test be conducted after sealing, because inferior data retention of the EPROM occurs to some degree after the sealing step.

The OTP type EPROM is exemplified by the HN482764P-3, which is disclosed in "HITACHI IC MEMORY DATA BOOK", pp. 263, issued by Hitachi, Ltd., in May, 1984.

SUMMARY OF THE INVENTION

An object of the present invention is to provide a programmable semiconductor memory device which can test deterioration of data retention and which can be used by an OTP type EPROM.

Another object of the present invention is to provide a method of testing a semiconductor memory device, which facilitates the inferior data retention test of a programmable semiconductor memory device such as an OTP type of EPROM.

Still another object of the present invention is to provide a method of testing for defects in a memory cell of a semiconductor memory device, which is enabled to store data by injecting charges, without any injection of the charges into a memory cell having no defects.

A further object of the present invention is to provide a semiconductor memory device which is suitable for the above-specified test.

A further object of the present invention is to provide a semiconductor memory device which uses an address terminal for the defect test of the memory cell bjects and the novel The aforementioned and other o features of the present invention will become apparent from the following description taken with reference to the accompanying drawings.

Representative examples of the invention to be disclosed hereinafter will be briefly described in the following a data line is A PROM is held in the state where maintained at a low potential whereas a voltage is applied to a word line. As a result, testing an inferior memory cell caused by a defective insulating film between a substrate and a floating gate, and between a floating gate and a control gate, can be realized without writing any data in the individual memory cells.

The testing method includes a stress-applying step for aging in the state where the data line is maintained at the low level potential whereas a writing voltage is applied to the word line; a (charge gain testing) step of testing a memory cell at a high threshold voltage; and a (charge loss testing) step of testing a memory cell at a low threshold voltage This makes it possible to test the deterioration in the memory cells without writing any data in the individual memory cells As a result, it is possible to test the PROM thereby to improve the reliability of the PROM of the specified kind.

BRIEF DESCRIPTION OF THE DRAWINGS

FIGS. 3A and 3B are schematic sections showing the charge gain and loss states of a memory cell;

DESCRIPTION OF THE PREFERRED EMBODIMENTS

Figure 1:
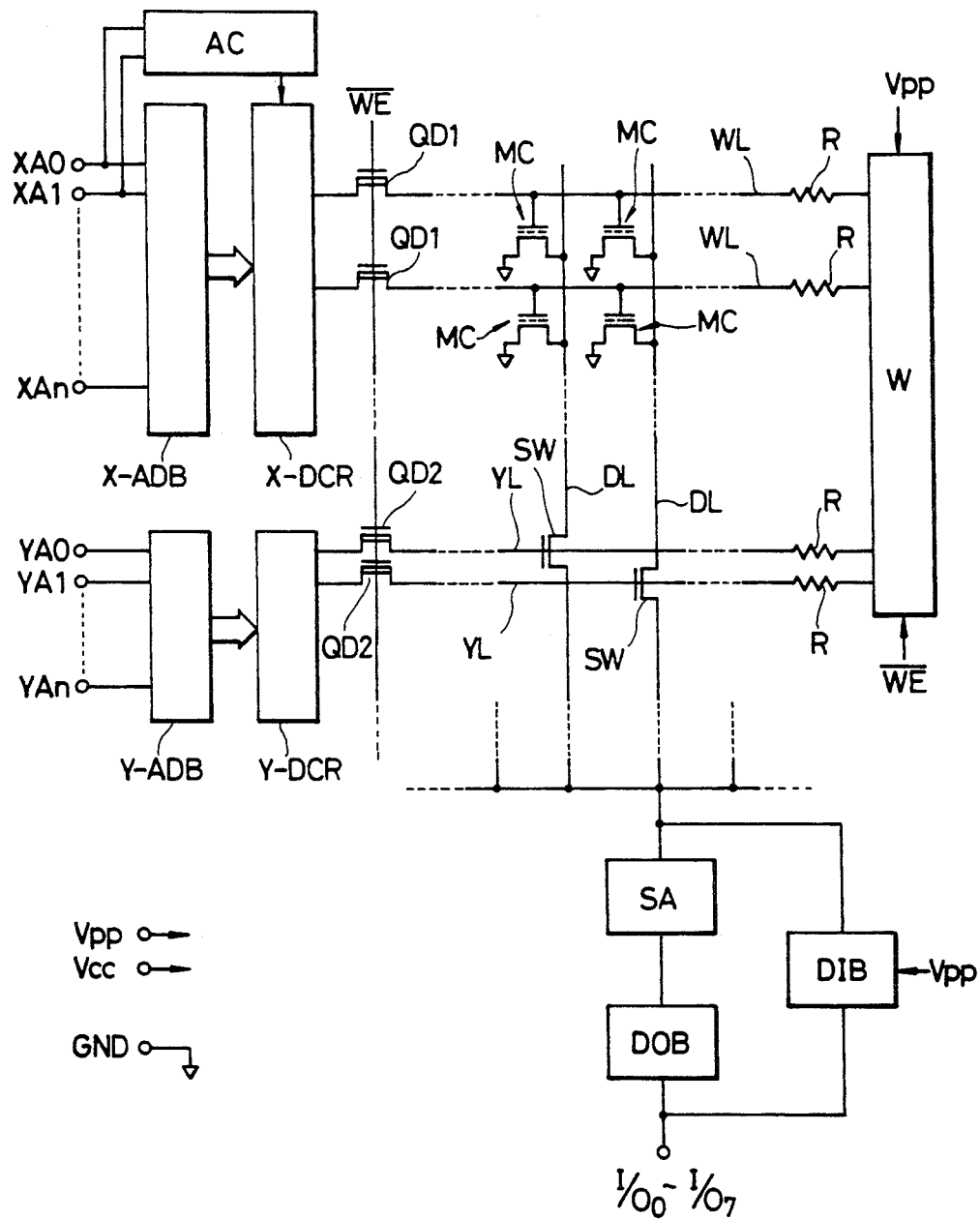
FIG. 1 is a block diagram showing one embodiment of the present invention.

FIG. 1 shows an embodiment in which the present invention is applied to an OTP type EPROM.

A memory cell MC is arranged in the shape of a matrix to form a memory array. In this memory array, more specifically, the memory cell MC is so arranged as to correspond to the intersections between word lines WL extending in rows and data lines DL extending in columns In the periphery of the memory array. there are arranged according to the present invention an address control circuit AC and peripheral circuits such as an X-decoder X-DCR, a Y-decoder Y-DCR, an X-address buffer X-ADB, a Y-address buffer Y-ADB, a sense amplifier SA, a data input buffer DIB, a data output buffer DOB, and a write circuit W.

Figure 5:
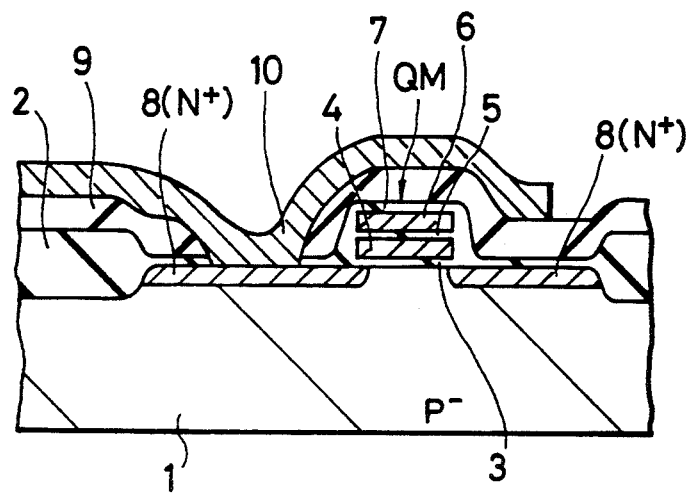
FIG. 5 is a sectional view showing the construction of an EPROM to which the present invention is applied.

The memory cell MC comprises, as shown in FIG. 5, an N-channel MOSFET $Q_M$ having a floating gate 4 and a control gate 6. The MOSFET $Q_M$ is formed on the main surface of a semiconductor substrate 1 which is made of P$^-$-type single crystal silicon. The floating gate electrode 4 and the control gate electrode 6 are made of polycrystalline silicon films, for example. The control gate electrode 6 is used as one of the word lines WL. First and second gate insulating films 3 and 5 are made of silicon oxide films. The oxide films 3 and 5 are formed on the surfaces of the substrate 1 and the floating gate electrode 4, respectively, by thermally oxidizing thereof An insulating film 7 is a silicon oxide film which is formed by thermally oxidizing the control gate electrode 6. N$^+$-type semiconductor regions 8 for providing source and drain regions are formed in self-alignment with the gate electrodes 4 and 6. With one of the N$^+$-type regions, there is connected one of the data lines DL of aluminum wiring 10 through a contact hole which is formed in an insulating film such as a phosphosilicate glass film 9. The other N$^+$-type region is extended in the same direction of the word lines WL so that it is used as wiring for applying ground potential GND to the memory cell MC. Reference numeral 2 indicates a field oxide film.

The insulating film, which covers the floating gate 4 for storing charges as data, especially the insulating film 3 between the substrate 1 and the floating gate 4 and the insulating film 5 between the floating gate 4 and the control gate 6 must not be defective. Through the defects, if any, the charges of the floating gate 4 will leak to the substrate 1 or the control gate 6.

Figure 6:
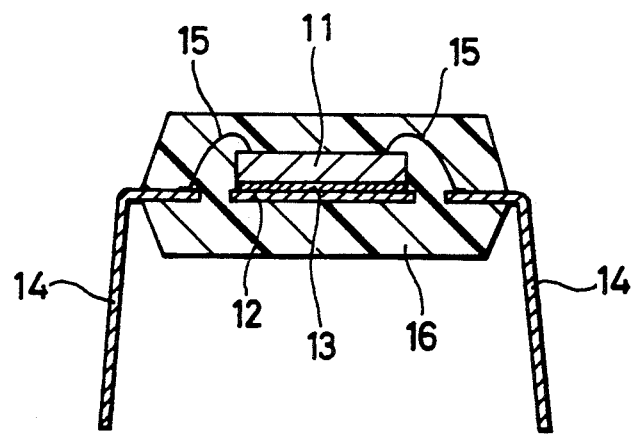
FIG. 6 is a sectional view showing the sealed state of the EPROM to which the present invention is applied.

The EPROM thus constructed is sealed up, as shown in FIG. 6, into a plastic package More specifically, an EPROM chip 11 is mounted on a tab 12 by means of a silver paste 13 and is molded of a plastic resin 16. Numerals 14 and 15 indicate a lead and a bonding wire, respectively. These tab 12, lead 14, bonding wire 15 and resin 16 are made of well-known materials The resin 16 is made black, and is opaque even to ultraviolet rays As a result, this OTP type EPROM cannot release the charges which are stored in the memory cell transistor $Q_M$. In other words, the data cannot be erased and rewritten once they have been written.

Adoption of the plastic package is effective for reducing the production cost of the device. Most EPROMs are written into only once. Therefore, even an unerasable and unreprogrammable EPROM can find a wide range of application.

The word lines WL made of the control gates 6 of the memory cells MC each have one end connected through a depletion type N-channel MOSFET QD1 with the X-decoder X-DCR acting as word line selecting means. The other ends of the word lines WL are connected through resistors R with the write circuit W for applying a write voltage Vpp (e.g., 12.5 V) to the word lines WL and the data lines DL when in a write operation. A write enable signal $\overline{WE}$ is applied to the gate electrode of the MOSFET QD1, which is an internal write control signal prepared from a not-shown external program signal. This write enable signal $\overline{WE}$ is set at a low level when a high voltage, i.e., the write voltage Vpp is applied to the word lines WL, i.e., in a write operation and when in a stress-applying operation which will be described hereinafter. When in a read operation, during charge gain testing and charge loss testing, conversely, the signal $\overline{WE}$ is set to a high level. The resistor R is made of a polycrystalline silicon film having a relatively high resistance, for example. The X-address buffer X-ADB introduces an external address signal thereinto from the outside of the IC through the X-address terminals XA0 to XAn to prepare therefrom an internal complementary address signal. This internal complementary address signal is sent out from the X-address buffer X-ADB to the X-decoder X-DCR. This X-decoder X-DCR selects the word line WL corresponding to the internal complementary address signal. The X-address buffer X-ADB and the write circuit W are constructed using well-known circuits for these purposes. The construction of the X-decoder X-DCR will be described hereinafter.

The data lines DL are connected with the sense amplifier SA, the input buffer DIB and the output buffer DOB through switch elements SW composed of Nchannel MOSFETs. The input and output circuits DIB and DOB are connected with data terminals I/O$_0$ to I/O$_7$. In accordance with a predetermined internal timing signal, the input or output circuit DIB or DOB inputs or outputs data through the data terminals I/O$_0$ to I/O$_7$ In fact, the sense amplifier SA, and the data input and output buffers DIB and DOB are provided in a number corresponding to the terminals I/O$_0$ to I/O$_7$. The selecting switch elements SW have their gate electrodes connected with Y-selecting lines YL. These Y-selecting lines YL each have one end connected with the Y-decoder Y-DCR through depletion type N-channel MOSFETs QD2. The other ends of the Y-selecting lines YL are connected with the writing line W through the resistors R. The Y-address buffer Y-ADB, acting as a data line selecting means, introduces an external address signal thereinto from the outside of the IC through Y-address terminals YA0 to YAn to prepare an internal complementary address signal. This internal complementary address signal is sent out from the Y-address buffer Y-ADB to the Y-decoder Y-DCR. This Y-decoder Y-DCR turns on the switch element SW corresponding to that internal complementary address signal. As a result, the data line DL selected is connected with the sense amplifier SA or the input circuit DIB. The sense amplifier SA, the Y-decoder Y-DCR and the Y-address buffer Y-ADB may be constructed of well-known circuits, and their explanations are omitted here.

In accordance with the present invention, the address control circuit AC is connected with the two of the X-address terminals XA0 to XAn, e.g., the terminals XA0 and XA1. The output of the address control circuit AC is sent out to the X-decoder X-DCR. The address control circuit AC is provided to control the potentials of the word lines WL in the testing step according to the present invention.

Figure 2:
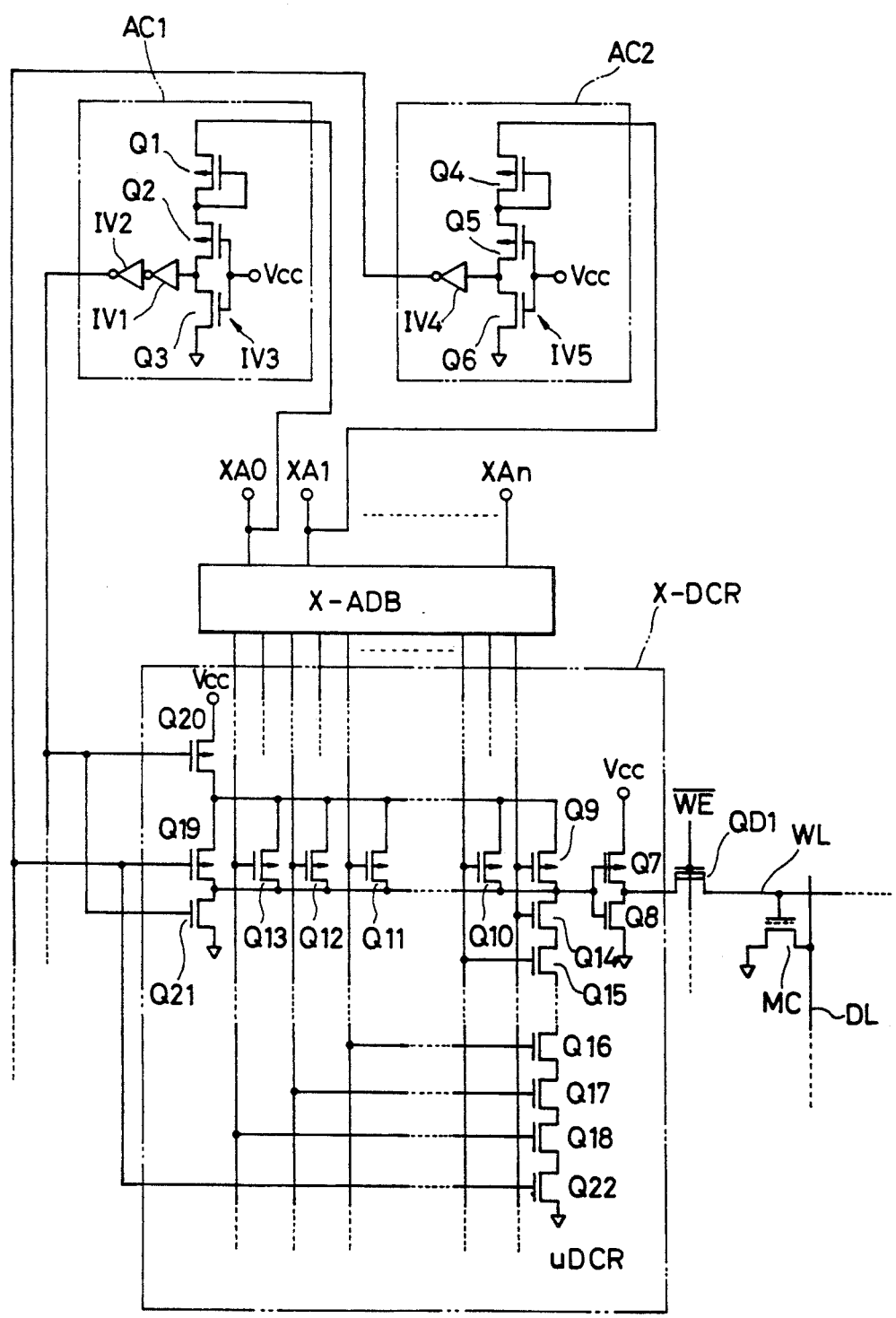
FIG. 2 is a circuit diagram showing an essential portion of FIG. 1.

The details of the X-address decoder X-DCR and the address control circuit AC are shown in FIG. 2.

The X-decoder X-DCR is equipped with a plurality of unit circuits UDCR. These unit circuits UDCR are provided to correspond to the word lines WL. Each unit circuit comprises, as shown in FIG. 2, a NAND gate circuit composed of P-channel MOSFETs Q9 to Q13 connected in parallel and N-channel MOSFETs Q14 to Q18 connected in series and an inverter circuit composed of a P-channel MOSFET Q7 and an N-channel MOSFET Q8. To the gate electrodes of the MOSFETs Q9 to Q18, there are applied predetermined complementary address signals which are sent out from the X-address buffer X-ADB. There is also provided a P-channel MOSFET Q19 which is connected in parallel with the MOSFETs Q9 to Q13. There is further provided an N-channel MOSFET Q22 which is connected in series with the MOSFETs Q14 to Q18. A P-channel MOSFET Q20 is further provided between the MOSFETs Q9 to Q13 and a power source potential Vcc. An N-channel MOSFET Q21 is further provided between the output terminal of the NAND gate circuit and the ground potential GND. A first circuit AC1 (which will be described hereinafter) of the address control circuit AC has its output applied to the gate electrodes of the MOSFETs Q20 and Q21. A second circuit AC2 (which will also be described hereinafter) of the address control circuit AC has its output applied to the gate electrodes of the MOSFETs Q19 and Q22. These MOSFETs Q19 to Q22 can be deemed as switch elements or NOR gates which are to be controlled by the address control circuit AC. In the testing step according to the present invention, the potentials of the word lines WL are set at a high voltage or at ground by the control circuit AC, i.e., the circuits AC1 and AC2. This address control circuit AC is equipped with the first circuit AC1 and the second circuit AC2.

The first circuit AC1 is composed of P-channel MOSFETs Q1 and Q2, an N-channel Q3, and CMOS inverters IV1 and IV2. The MOSFET Q1 acts as a load to be exerted upon a CMOS inverter IV3 composed of the MOSFETs Q2 and Q3. A suitable fixed potential, e.g., the power source potential Vcc, e.g., 5 V, is applied to the gate electrodes of the MOSFETs Q2 and Q3. The source of the P-channel MOSFET Q2 is connected with the aforementioned address terminal XA0 through the MOSFET Q1. The output of the inverter IV3 is applied through the inverters IV1 and IV2 to the respective MOSFETs Q20 and Q21 of each unit circuit UDCR. The inverter IV3 outputs a high level signal when the X-address terminal XA0 is fed with a voltage higher than 5 V, i.e., in fact, a voltage of 7 to 8 V or higher, which is the summation of the high level, i.e., 5 V, of the address signal and a margin. The inverter IV3 outputs a low level signal when the X-address terminal XA0 is fed with the high, i.e., 5 V, or low, i.e., 0 V, level of the ordinary address signal. In the embodiment being described, the logical threshold voltage of the inverter IV3 is so set in accordance with the gate voltage Vcc and the sizes of the MOSFETs Q1 to Q3 as to conduct the aforementioned operations. The first circuit AC1 outputs the low level when in the ordinary reading operation in response to the high or low level, i.e., 5 V or 0 V, of the address signal. In the testing step of the memory cells of the EPROM, the first circuit AC1 outputs the high level by discriminating the signal which is input through the X-address terminal left unused in that step.

The second circuit AC2 comprises P-channel MOSFETs Q4 and Q5, an N-channel MOSFET Q6, and a CMOS inverter IV5. The second circuit AC2 is made identical to the circuit which is simplified by omitting the inverter IV2 from the first circuit AC1. The source of the MOSFET Q4, i.e., the input terminal of the second circuit AC2 is connected with the X-address terminal AX1. The CMOS inverter IV5 composed of the MOSFETs Q5 and Q6 is made identical to the inverter IV3. As a result, the second circuit AC2 outputs, like the first circuit AC1, the low level when in an ordinary read operation and the high level in the testing step.

The method of testing an OTP type EPROM thus constructed will be described in the following.

(1) Stress Applying Step, i.e., Heating and Voltage-Applying Step

The target of the test or the OTP type EPROM is aged, i.e., maintained for a time, at a predetermined temperature in an aging apparatus. This can be done, for example, by maintaining the device at 150° C. in an atmosphere of air and inserting the leads of the device into a socket for exerting predetermined voltages for the stress application. At 150° C., an aging time of 8 to 16 hours can be used, although the invention is not limited to this (and noting that the aging time will change depending on the temperature). Stress voltage is applied throughout the aging. Preferably, the temperature range for aging is between 100° to 150° C., noting in particular that the heat resistance of the plastic resin 16 must be taken into account. During the aging, the external terminal Vpp, Vcc and GND are held at 12.5 V (stress voltage=Vpp), 5 V (=Vcc) and 0 V (=GND), respectively, in order to apply the stress voltage (12.5 V) to all word lines and to make the circuits operative. The address terminal XA0 is held at Vpp, while another terminal (leads) is fixed at GND (or Vcc). Threshold voltage of the memory cell MISFET is 0.5 V, for example, before injecting carriers. A range of the threshold voltage shift depends on the degree of defects in the first and second gate oxide film.

The following condition is set so as to detect a defect without injecting any charge into a memory cell MC having no defects. Namely, the word lines WL are fed with a relatively high voltage, e.g., the write voltage Vpp whereas the data lines DL are fed with the ground potential or a near potential. For this conditioning, the address control circuit AC is used.

The X-address terminal XA0 is fed with such a high voltage that the inverter IV3 will output the high level signal. The write voltage Vpp, i.e., 12.5 V, is applied in the present embodiment. As a result, the high level signal is fed through the inverters IV1 and IV2 to the MOSFETs Q20 and Q21. As a result, the MOSFET Q20 is rendered nonconductive whereas the MOSFET Q21 is rendered conductive.

The X-address terminal XA1 is fed with such a low voltage that the inverter IV5 will output a low level signal. The low voltage is exemplified in the present embodiment by 0 V or 5 V, i.e., the ground potential or the power source potential. As a result, the low level signal is output from the inverter IV5. This low level signal is inverted by an inverter IV4 and fed to the MOSFETs Q19 and Q22. As a result, the MOSFET Q19 is rendered nonconductive whereas the MOSFET Q22 is rendered conductive.

Thus, the output of each unit circuit UDCR is held at the high level irrespective of the level of the X-address signal, i.e., the complementary address signal. In other words, all the outputs of the X-decoder X-DCR take the high level. As a result, the above-specified high level signal, e.g., 5 V, is applied to the source of the MOSFET QD1. The low level, i.e., 0 V, of the write enable signal WE is applied to the gate electrode of the MOSFET QD1 during the stressing step. During this stressing step, the high voltage for the stress application, e.g., the write voltage Vpp, is applied from the write circuit W to all the word lines WL. As a result, the MOSFET QD1 is rendered nonconductive so that the high voltage Vpp is applied to the individual word lines WL through the resistors R.

During the stressing step, all the data lines DL are in the non-write state, i.e., in the unselected state. Specifically, the drains of the individual memory transistors $Q_M$ are either at ground poential, i.e., 0 V, or in a state close to the former,i.e., in a floating state near 0 V.

This is realized by the following method. All the switch elements SW are rendered nonconductive by the Y-decoder Y-DCR. Alternatively, the discharging MOSFETs,connecting with data lines DL at one end thereof to which the switch elements SW are not connected, are rendered conductive before or during the stressing step. In the state where all the switch elements are turned on by the Y-decoder Y-DCR, alternatively, ground potential is fed from the input/output terminals through the input buffer DIB to the data lines DL.

By these operations, the MOSFETs $Q_M$ of all the memory cells MC come into the state in which their control gates, sources and drains are set at the high voltage Vpp, the ground potential GND and the ground potential GND, respectively.

A suitable potential such as ground potential may be applied to the X-address terminals XA2 to XAn.

After this aging has been continued for several hours, the following phenomena appears in defective memory cells when an electric field stress is applied among the control gates, floating gates and substrates of all the memory cells.

Figure 3A:
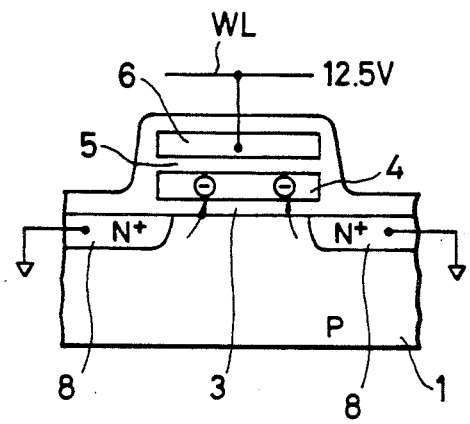
Figure 3A:
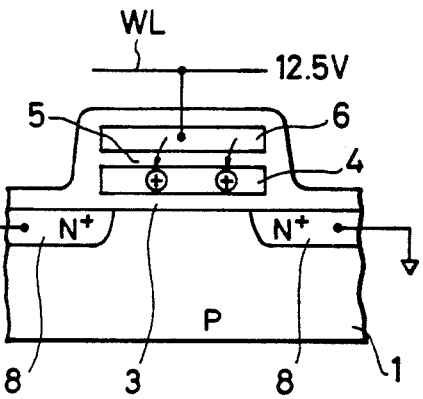

In a memory cell where a defect is caused in the insulating film 3 between the semiconductor substrate 1 and the floating gate 4, as shown in FIG. 3A, those electrons (or the negative charges) of the substrate 1, which are attracted by the electric field of the control gate 6, leak through the aforementioned defect until they are stored in the floating gate 4. As.a result, the threshold voltage Vth of that memory cell is boosted, i.e., a charge gain, as in the case when the so-called "write" has been conducted. In the memory cell where a defect is caused in the insulating film 5 between the floating gate 4 and the control gate 6, as shown in FIG. 3B, the positive charges of the control gate 6 are expelled toward the substrate until they are stored in the floating gate 4 through the aforementioned defect. It can also be conceived that positive holes remain from which the electrons in the floating gate 4 have been attracted into the control gate 6 by the electric field of the control gate 6. As a result, that memory cell has its threshold voltage Vth reduced, i.e., a charge loss, so that it becomes the depletion type.

Either of those memory cells are so defective as to degrade the characteristics of the normal EPROM. Thus, it is tested during or after aging whether a defective memory cell is present. This is followed by eliminating a chip having such a memory cell as a defective one.

(2) Charge Gain Testing Step

A memory cell which has had its threshold voltage Vth raised as a result of a charge gain is in the same state as one that has been subjected to a write operation. It follows that the conventional reading method can be used as it is for detecting such a defective memory cell.

Figure 4A:
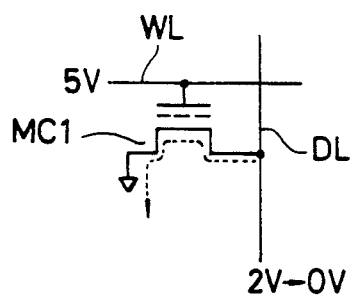
FIGS. 4A to 4B are circuit diagrams showing a portion of the memory cell for explaining the respective methods of testing the charge gain and loss.
Figure 4C:
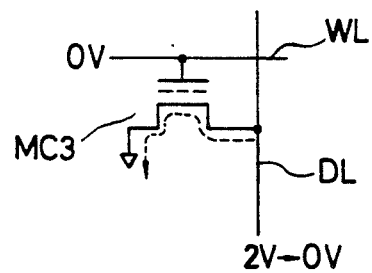
Figure 4B:
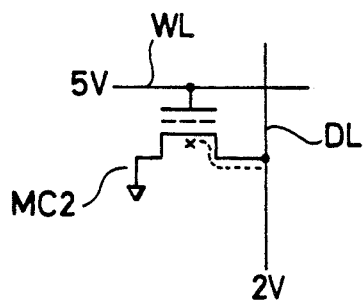

The high level of the write enable signal $\overline{WE}$ prepared from a not-shown program signal $\overline{PGM}$ is applied to the MOSFETs QD1 and QD2. One end of each word line WL connected with the write circuit W is set at ground potential GND, for example. The address signals are input to the X-address terminals XA0 to XAn and the Y-address terminals YA0 to YAn. As a result, the high level is applied to one selected word line WL and one MOSFET QD2 corresponding to one selected Y-selecting line YL is rendered conductive to connect the selected data line DL with the sense amplifier SA. The variations of the potential of the data line DL are detected by the sense amplifier SA. The potentials of the individual data lines are precharged to 2 V, for example, by a not-shown precharge circuit. As shown in FIG. 4A, a normal memory cell MC1 is turned on by the high level of the word line WL so that the potential of the data line DL at 0 V is detected by the sense amplifier SA. As shown in FIG. 4B, however, a defective memory cell MC2 is held in its off state by the rise of the threshold voltage, even when the word line WL is at the high level, so that the precharge voltage, i.e., 2 V, can be detected as it is. A defective memory cell in the charge gain state can be tested by subjecting all the memory cells to the aforementioned procedures.

Even when the threshold voltages of the memory cells fail to rise to the voltage applied to the word lines, i.e., when the charge gain is small, a certain memory cell can be shown to be defective by detecting slight potential variations of the data lines.

(3) Charge Loss Testing Step

In order to detect that the MOSFETs $Q_M$ of the memory cells are of the depletion type, the read operation is conducted with all the word lines WL set to ground potential. For this operation, the control circuit AC is used.

To the X-address terminal XA0, there is applied such a low voltage that the inverter IV3 may output a low level signal. In the present embodiment, the low voltage applied is 0 V or 5 V, i.e., ground potential or the power source potential. As a result, the low level signal is output from the inverter IV3. This low level signal is applied through the inverters IV1 and IV2 to the MOSFETs Q20 and Q21. As a result, the MOSFET Q20 is rendered conductive whereas the MOSFET Q21 is rendered nonconductive.

To the X-address terminal XA1, conversely, there is applied such a high voltage that the inverter IV5 may output a high level signal In the present embodiment, the voltage applied is the write voltage Vpp, i.e., 12.5 V. As a result, the high level signal is output from the inverter IV5 This high level signal is inverted by the inverter IV4 and is applied to the MOSFETs Q19 and Q22. As a result, the MOSFET Q19 is rendered conductive whereas the MOSFET Q22 is rendered nonconductive.

Therefore, the output of each unit circuit UDCR is set at the low level irrespective of the level of the X-address signal, i.e., the complementary address signal. In other words, all the outputs of the X-decoder X-DCR are set at the low level. As a result, the MOSFET QD1 has its source fed with the aforementioned low level signal such as 0 V. The low level, i.e., 0 V, of the write enable signal $\overline{WE}$ is applied is the gate electrode of the MOSFET QD1 during the charge loss testing step. On the other hand, ground potential, for example, is applied to the one-terminals of the words line WL from the write circuit W. As a result, the MOS- FET QD1 is rendered conductive so that the low level signal is applied to the individual word lines WL.

Figure 4D:
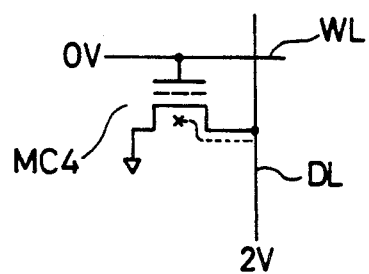

On the other hand, the Y-address signal is input to the Y-address terminals YA0 to YAn as in an ordinary reading operation, and the individual data lines DL are selectively connected with the sense amplifier SA. Moreover, the variations of the potential of the data lines precharged to 2 V, for example, are detected by the sense amplifier SA. As a result, as shown in FIG. 4C, a defective memory cell MC3 having a low threshold voltage (of the depletion type) in the charge loss state is turned on, despite the fact that its gate potential is at 0 V, so that the potential of the data line is reduced to give a read voltage of 0 V., Conversely, a normal memory cell MC4 is in its off state because the word line potential is at 0 V, so that the precharge voltage, i.e., 2 V of the data line can be detected as it is by the sense amplifier SA, as shown in FIG. 4D. By conducting these operations for the individual data lines, it is charge loss state.

In this test, all the data lines DL can be simultaneously subjected to read tests. This is because the read voltage of the sense amplifier SA falls to 0 V if any memory cell is defective.

As in the charge gain testing step, even a small variation of the threshold voltage of the memory cell can be detected.

The two kinds of defects, which are caused in the memory cells, can be tested absolutely reliably by conducting the tests for charge gain and charge loss. Even with these tests, neither positive nor negative charges are stored in the normal memory cells. Since an OTP type EPROM having no defects is not written into by the tests, the device can be supplied in its unwritten state to the user.

With the construction thus far described, the peripheral circuits can be automatically set in the stressing state or in the charge loss testing state if 12.5 V is applied to the X-address terminals XA0 and XA1, respectively, at the stressing step and at the charge loss testing step. Moreover, it is unnecessary to provide a new terminal for the tests.

The terminals to be used for the aforementioned tests may be those other than XA0 and XA1. The terminals to be used for applying the signal for the stressing step to the control circuit AC may be either the X-address terminals, the Y-address terminals or the data input/output terminals I/O, if necessary, other than the terminals left unused during the stressing step, such as the terminals XA0 and XA1. The terminals to be used for applying the signal for the charge loss testing step may be the terminals left unused for the charge loss testing step, such as the X-address terminals other than the terminals XA0 and XA1.

The control circuits AC1 and AC2 may have another construction if they can detect a signal applied to their terminals and indicating the testing steps and can send out the high or low level in accordance with that signal. In other words, the control circuits AC1 and AC2 may be those which can output, when the normal high level, i.e., 5 V, or low level, i.e., 0 V, is applied to their terminals, a signal in opposed phase to that of the signal which is output when a voltage higher than that high level is applied to their terminals.

Figure 7:
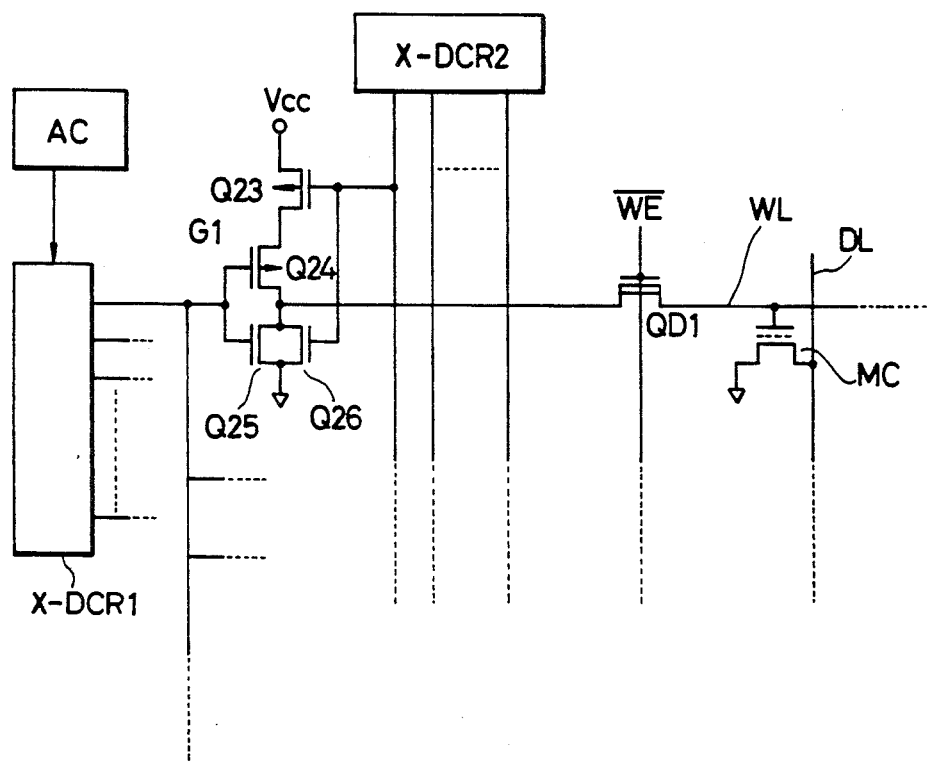
FIGS. 7 and 8 are partial circuit diagrams for explaining other examples of the present invention

The X-decoder X-DCR may be constructed of two stages, i.e., a first X-decoder X-DCR1 and a second decoder X-DCR2, as shown in FIG. 7. Of these, the first decoder is fed with the internal address signals corresponding to the X-address signals AX0 to AX(n-3), for example, from the X-address buffer X-ADB. The second decoder X-DCR2 is fed with the internal address signals corresponding to the X-address signals AX(n-2) to AXn of three bits, for example, from the X-address buffer X-ADB. The unit circuit of the first decoder X-DCR1 is constructed by eliminating the MOSFETs Q7 and Q8 from the unit circuit UDCR of the X-decoder X-DCR shown in FIG. 2. The unit circuit of the second decoder X-DCR2 is constructed by eliminating the MOSFETs Q7, Q8, and Q19 to Q22 from the unit circuit UDCR of the X-decoder X-DCR shown in FIG. 2. The respective outputs of the first and second decoders XDCR1 and X-DCR2 are output to the respective word lines WL through a NOR gate circuit Gl which is composed of P-channel MOSFETs Q23 and Q24 and N-channel MOSFETs Q25 and Q26.

In the stressing step, 12.5 V is applied to the address terminal XA0 whereas the voltage of 0 V or 5 V is applied to the address terminal XA1. All the outputs of the first decoder X-DCR1 are reduced to the low level by the address control circuit AC, irrespective of the X-address signals AX0 to AX(n−3). One of the eight outputs of the second decoder X-DCR2 is reduced to the low level by the X-address signals AX(n−2) to AXn. As a result, the gate circuit Gl outputs the high level to apply the electric field stress to the memory cells MC. In accordance with this example, the stressing step is separately conducted eight times by sequentially varying the outputs of the second decoder X-DCR2.

In the charge loss testing step, 0 V or 5 V is applied to the address terminal XA0 whereas 12.5 V is applied to the address terminal XA1. By the address control circuit AC, all the outputs of the first decoder X-DCR1 are raised to the high level irrespective of the X-address signals AX0 to AX(n−3). The gate circuit G1 outputs the low level irrespective of the X-address signals AX(n−2) to AXn. As a result, the potentials of the individual word lines are set at the low level.

In the ordinary writing or reading operation, only the gate circuit G1, in which both the first and second decoders X-DCR1 and X-DCR2 have their outputs set at the low level, sends out the high level. As a result, one word line is selected.

According to the present invention, a defect can be detected even when it is present in the insulating film on the side of the floating gate 4.

The following effects can be attained according to the present invention.

Charge gain and charge loss can be induced in the defective memory cell without injecting the charges into memory cells having no defects, by conducting aging with all the word lines being fed with a high voltage. Since the device is so constructed that all the word lines can be reduced to 0 V, the presence of a memory cell in which a charge loss has occurred can be promptly detected by detecting the voltages of the data lines.

Since the tests can be conducted in accordance with the voltage applied to the address terminals, they can be performed without any increase in the number of the terminals.

Defects in memory cells are tested by the method including: the stressing step of performing aging while the data lines are held at 0 V while the word lines are fed with a high voltage; the charge gain step of testing the memory cell having its voltage raised to the threshold level; and the charge loss testing step of testing the memory cell in the depletion type. As a result, a defective memory cell can be detected without writing into it. A semiconductor memory device which cannot be subjected to a writing test after it has been sealed, such as an OTP type EPROM, can be tested highly reliably.

In the stressing step, aging is conducted by applying the high voltage simultaneously to all the word lines, and, in the charge loss testing step, the data lines are read out by setting all the word lines simultaneously to 0 V. As a result, in the stressing step and in the charge loss testing step, the stressing and testing operations of all the memory cells can be performed simultaneously or substantially simultaneously to shorten the time period for the tests.

The defect test of a memory cell can be performed even after it has been sealed into a plastic package which is opaque to ultraviolet rays. This makes it possible to detect even defects in a memory cell, which has been induced by various causes, e.g., mechanical stress during forming or mold stress, after the wafer has been completed.

Although our invention has been described specifically in connection with its embodiments, it should not be limited thereto but can naturally be modified in various ways without departing from the gist thereof.

The potentials of the word lines WL in the testing step can be determined without any use of the address control circuits AC1 and AC2.

Figure 8:
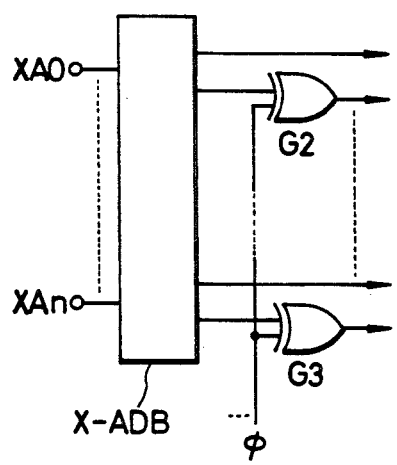

For example, as shown in FIG. 8, the potentials of the word lines WL can be controlled by means of exclusive OR gate circuits G2 and G3. In the stressing step, all the X-address signals are set at the high level. As a result, one of the internal (or complementary) address signals fed out from the X-address buffer X-ADB is set at the high level whereas the other is set at the low level. The low level of all the internal address signals is input to one of the gate circuits G2 and G3. The outputs of the gate circuits G2 and G3 are raised to the high level by the high level of the signal φ input to the other of the gate circuits G2 and G3. As a result, all the internal address signals are raised to the high level.

In the charge loss testing step, all the X-address signals are reduced to the low level. As a result, one of the internal (or complementary) address signals fed out from the X-address buffer X-ADB is set at the high level whereas the other is set at the low level. The low level of all the internal address signals is input to one of the gate circuits G2 and G3. The outputs of the gate circuits G2 and G3 are reduced to the low level by the high level of the signal φ input to the other of the gate circuits G2 and G3. As a result, all the internal address signals are reduced to the low level.

In the normal reading and writing operations, the signal φ is reduced to the low level.

In this modified example, the X-decoder X-DCR is constructed by omitting the MOSFETs Q19 to Q22 from the X-decoder X-DCR of FIG. 2.

In the stressing operation or in the charge loss testing operation, the word line may be selected on the basis of the address signal to apply 12.5 V or 0 V. According to this modified system, however, especially in the stressing step, a longer time period than that of the preceding example is required for retaining the desired stressing operation for each memory cell.

The description thus far described has been directed mainly to the case in which our invention is applied to an OTP type EPROM or a background field of its application. The present invention should not, however, be limited to this configuration, but can be applied to an EPROM which can be erased with ultraviolet rays. According to the present invention, a significant benefit can be attained in that the time period for the defect tests can be shortened, and also in that the written data after the tests need not be erased. The present invention can be applied widely to a semiconductor memory device composed of MIS, i.e., Metal Insulator Semiconductor, FETs have floating gates, and a semiconductor memory device using charge storing type transistors such as an EEPROM. In either application, the first and second insulating films and the insulating film covering the floating gate need not be made of silicon oxide films. The present invention can also be applied to an EPROM on-chip microcomputer, i.e., a device in which the EPROM is formed on the microcomputer chip. The present invention can be further applied to a memory IC card equipped with a plurality of memory IC chips when it includes an EPROM.

We claim:

1. A method of testing a semiconductor integrated circuit device including: a semiconductor substrate; word lines and data lines formed on said semiconductor substrate; and memory cells formed on said semiconductor substrate and arranged to correspond to the intersections between said data lines and said word lines, said memory cells including MISFETs having control gates connected with said word lines, floating gates, semiconductor regions connected with said data lines, and semiconductor regions connected with a ground potential line, whereby said memory cells store data by having said floating gates stored with charges, comprising the steps of:

applying a predetermined stress voltage to said word lines whereas a voltage equal to or near the ground potential is applied to said dat alines, wherein said stress voltage has a level sufficiently high to change the threshold voltage of memory cells having insulation defects adjacent to said floating gates during said applying step;

testing said memory cells, after said applying step, to detect the presence of a memory cell which has its threshold voltage raised by said applying step; and testing said memory cells, after said applying step, to detect the presence of a memory cell which has had its threshold voltage changed to have depletion-type transistor characteristics as a result of an insulation defect adjacent to said floating gates, wherein said MISFETs each include an upper insulation film between said floating gate and said control gate, and a lower insulation film between said floating gate and said semiconductor substrate, wherein said testing step to detect the presence of memory cells having their threshold voltage raised by said applying step will detect those MISFETs having a defective lower insulation film, and said testing step to detect the presence of memory cells having their threshold voltage lowered by said applying step will detect those memory cells having a defective upper insulation film.

2. A method of testing a semiconductor integrated circuit device according to cla said semiconductor integrated circuit device further includes:

an X-decoder for selecting predetermined ones of said word lines in response to X-address signals;

a plurality of external terminals for introducing external signals;

a first circuit for controlling the output of said X-decoder; and a second circuit for controlling said first circuit in accordance with a control signal introduced from at least one of said external terminals, wherein said first circuit is so controlled in said aging step by said second circuit having introduced the control signal from said external terminals to control the output of said X-decoder to apply said predetermined stress voltage to said word lines.

3. A method of testing a semiconductor integrated circuit device according to claim 1, wherien said semiconductor integrated circuit device further includes:

an X-decoder for selecting predetermined ones of said word lines in response to X-address signals;

a plurality of external terminals for introducing external signals;

a first circuit for controlling the output of said X-decoder; and a second circuit for controlling said first circuit in accordance with a control signal introduced from at least one of said external terminals, wherein said first circuit is so controlled in said testing step for detecting reduction of the threshold voltage by said second circuit having introduced the control signal from said external terminal to control the output of said X-decoder to apply group potential to said word lines.

4. A method of testing a semiconductor integrated circuit device according to claim 1 wherein said stress voltage has a voltage level substantially equal to a writing voltage level for writing data into said memory cells.

5. A method of testing a semiconductor integrated circuit device including: a semiconductor substrate; word lines and data lines formed on said semiconductor substrate; and memory ells formed on said semiconductor substrate and arranged to correspond to the intersections between said data lines and said word lines, said memory cells including MISFETs having control gates connected with said word lines, floating gates, semiconductor regions connected with said data lines, and semiconductor regions connected with a ground potential line, whereby said memory cells store data by having said floating gates stored with charges, comprising the steps of:

aging said semiconductor integrated circuit device by heating in the state where a predetermined stress voltage is applied to said word lines whereas a voltage equal to or near the ground potential is applied to said data lines, wherein said stress voltage has a level sufficiently high to change the threshold voltage of memory cells having insulation defects adjacent to said floating gates during said aging step;

testing said memory cells, after said aging step, to detect the presence of a memory cell which has its threshold voltage raised by said aging step; and testing said memory cells, after said aging step, to detect the presence of a memory cell which has its threshold voltage reduced by said aging step, wherein said MISFETs each include an upper insulation film between said floating gate and said control gate, and a lower insulation film between said floating gate and said semiconductor substrate, wherein said testing step to detect the presence of memory cells having their threshold voltage raised by said aging step will detect those MISFETs having a defective lower insulation film, and said testing step to detect the presence of memory cells having their threshold voltage lowered by said aging step will detect those memory cells having a defective upper insulation film.

6. A method of testing an EPROM formed on a microcomputer chip including: a semiconductor substrate; word lines and data lines formed on said semiconductor substrate; and memory cells formed on said semiconductor substrate and arragned to correspond to the intersections between said data lines and said word lines, said memory cells including MISFETs having control gates connected with said word lines, floating gates, semiconductor regions connected with said data lines, and semiconductor regions connected with a ground potential lines, whereby said memory cells store data by having said floating gates stored with charges, comprising the steps of:

aging said EPROM by heating in the state where a predetermined stress voltage is applied to said word lines whereas a voltage equal to or near the ground potential is applied to said data lines, wherein said stress voltage has a level sufficiently high to change the threshold voltage of memory cells having insulation defects adjacent to said floating gates during said aging step;

testing said memory cells, after said aging step, to detect the presence of a memory ell which has its threshold voltage raised by said aging step; and testing said memory cells, after said aging step, to detect the presence of a memory cell which has its threshold voltage reduced by said aging step, wherein said MISFETs each include an upper insulation film between said floating gate and said control gate, and a lower insulationg film between said floating gate and said semiconductor substrate, wherein said testing step to detect the presence of memory cells having their threshold voltage raised by said aging step will detect those MISFETs having a defective lower insulation film, and said testing step to detect the presence of memory ells having their threshold voltage lowered by said aging step will detect those memory cells having a defective upper insulation film.

7. A method of testing a semiconductor integrated circuit device including: a semiconductor substrate; word lines and data lines formed on said semiconductor substrate; and memory cells formed on said semiconductor substrate and arranged to correspond to the intersections between said data lines and said word lines, said memory cells including MISFETs having control gates connected with said word lines, floating gates, semiconductor regions connected with said data lines, and semicondcutor regions connected with a ground potential line, whereby said memory cells store data by having said floating gates stored with charges, comprising the steps of:

aging said semiconductor integrated circuit device by heating in the state where a predetermined stress voltage is applied to said word lines whereas a voltage equal to or near the ground potential is applied to said data lines, wherein said stress voltage has a level sufficiently high to change the threshold voltage of memory cells having insulation defects adjacent to said floating gates during said aging step;

testing said memory cells, after said aging step, to detect the presence of a memory cell which has its threshold voltage raised by said aging step; and testing said memory cells, after said aging step, to detect the presence of a memory cell which has its threshold voltage reduced by said aging step;

wherein said semiconductor integrated circuit device further includes a package packaging said semiconductor substrate to cover said memory ells, said package being opaque to ultraviolet rays, and wherein said MISFETs each include an upper insulation film between said floating gate and said control gate, and a lower insulation film between said floating gate and said semiconductor substrate, wherein said testing step tod etect the presence of memory cells having their threshold voltage raised by said aging step will detect those MISFETs having a defective lower insulationg film, and said testing step to detect the presence of memory ells having their threshold voltage lowered by said aging step will detect those memory cells having a defective upper insulation film.

8. A method of testing an EPROM formed on a microcomputer chip including: a semiconductor substrate; word lines and data lines formed on said semiconductor substrate; and memory ells formed on said semiconductor substrate and arranged to correspond to the intersections between said data lines and said word lines, said memoryc ells including MISFETs having control gates connected with said word lines, floating gates, semiconductor regions connected with said data lines, and semiconductor regions connected with a ground potential line, whereby said memory ells store data by having said floating gates stored with changes, comprising the steps of:

aging said EPROM by heating in the state where a predetermined stress voltage is applied to said word lines whereas a voltage equal to or near the ground potential is applied to said data lines, whereins aid stress voltage has a level sufficiently high to change the threshold voltage of memory cells having insulation defects adjacent to said floating gates during said aging step;

testing said memory cells, after said aging step, to detect the presence of a memory cell which has its threshold voltage raised by said aging step; and testing said memory cells, after said aging step, to detect the presence of a memory cell which has its threshold voltage reduced by said aging step, wherein said EPROM on-chip microcomputer further includes a package packaging said semiconductor substrate to cover said memory cells, said package being opaque to ultraviolet rays, and wherein said MISFETs each include an upper insulation film between said floating gate and said control gate, and a lower insulation film between said floating gate and said semiconductor substrate, wherein said testing step to detect the presence of memory cells having their threshold voltage raised by said aging step will detect those MISFETs having a defective lower insulation film, and said testing step to detect the presence of memory cells having their threshold voltage lowered by said aging step will detect those memory cells having a defective upper insulation film.

* * * * *